(12) United States Patent
Ai et al.

(10) Patent No.: US 10,559,239 B2
(45) Date of Patent: Feb. 11, 2020

(54) PANEL TESTING DEVICE

(71) Applicants: BOE Technology Group Co., Ltd., Beijing (CN); Hefei Xinsheng Optoelectronics Technology Co., Ltd., Hefei (CN)

(72) Inventors: Yu Ai, Beijing (CN); Xuewu Xie, Beijing (CN); Bowen Liu, Beijing (CN); Shi Sun, Beijing (CN); Hao Liu, Beijing (CN); Kun Han, Beijing (CN); Ameng Zhang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 36 days.

(21) Appl. No.: 15/758,869

(22) PCT Filed: Oct. 24, 2017

(86) PCT No.: PCT/CN2017/107435
§ 371 (c)(1),
(2) Date: Mar. 9, 2018

(87) PCT Pub. No.: WO2018/171187
PCT Pub. Date: Sep. 27, 2018

(65) Prior Publication Data
US 2019/0035315 A1    Jan. 31, 2019

(30) Foreign Application Priority Data

Mar. 22, 2017 (CN) .......................... 2017 1 0174015

(51) Int. Cl.
*G01R 31/317* (2006.01)
*G09G 3/00* (2006.01)

(52) U.S. Cl.
CPC ......... *G09G 3/006* (2013.01); *G01R 31/3172* (2013.01); *G09G 2320/0693* (2013.01)

(58) Field of Classification Search
CPC ........... G09G 3/006; G09G 2320/0693; G01R 31/3172
See application file for complete search history.

(56) References Cited

U.S. PATENT DOCUMENTS 6,107,806 A * 8/2000 Field ..................... G09G 3/006
                                                    324/127
6,281,701 B1 * 8/2001 Yang ..................... G09G 3/006
                                                    324/233

(Continued)

FOREIGN PATENT DOCUMENTS

CN    1721861 A    1/2006
CN    2802510 Y    8/2006

(Continued)

OTHER PUBLICATIONS

Dec. 8, 2017—(WO) International Search Report and Written Opinion Appn PCT/CN2017/107435 with English Tran.

(Continued)

*Primary Examiner* — Dominic E Hawkins
(74) *Attorney, Agent, or Firm* — Banner & Witcoff, Ltd.

(57) ABSTRACT

Disclosed is a panel testing device. The panel testing device includes: a supporter and a plurality of test pins disposed on the supporter, wherein the plurality of test pins are in one-to-one correspondence with a plurality of signal pins on the tested panel, any one of the test pins satisfies d≤D≤d+L; wherein D is a width of the test pin, d is a width of the signal pin corresponding to the test pin, L is a minimum pitch between two adjacent signal pins.

17 Claims, 7 Drawing Sheets

(56) References Cited

U.S. PATENT DOCUMENTS

| | | | | |
|---|---|---|---|---|
| 6,675,469 B1 * | 1/2004 | Haba | .................... | H01L 21/486 257/E21.585 |
| 6,859,053 B1 | 2/2005 | Sato et al. | | |
| 2007/0047801 A1 * | 3/2007 | Kojima | ................ | G06T 7/0004 382/149 |
| 2010/0052719 A1 * | 3/2010 | Chiu | .................... | G01R 1/0416 324/760.01 |
| 2011/0084700 A1 * | 4/2011 | Kim | ...................... | G09G 3/006 324/403 |
| 2015/0145541 A1 * | 5/2015 | Kudo | .................... | G09G 3/006 324/750.19 |
| 2016/0091116 A1 * | 3/2016 | Shoecraft | ............. | H02G 3/0456 211/41.1 |
| 2017/0256188 A1 * | 9/2017 | Chang | ................... | G09G 3/006 |

FOREIGN PATENT DOCUMENTS

| | | |
|---|---|---|
| CN | 201138366 Y | 10/2008 |
| CN | 102136234 A | 7/2011 |
| CN | 102236036 A | 11/2011 |
| CN | 205333695 U | 6/2016 |
| CN | 106959381 A | 7/2017 |
| JP | 2010164452 A | 7/2010 |

OTHER PUBLICATIONS

May 10, 2019—(CN) Second Office Action Appn 201710174015.3 with English Translation.

* cited by examiner

PANEL TESTING DEVICE

CROSS-REFERENCE OF RELATED APPLICATION

The application is a U.S. National Phase Entry of International Application No. PCT/CN2017/107435 filed on Oct. 24, 2017, designating the United States of America and claiming priority to Chinese Patent Application No. 201710174015.3, filed on Mar. 22, 2017. The present application claims priority to and the benefit of the above-identified applications and the above-identified applications are incorporated by reference herein in their entirety.

TECHNICAL FIELD

Embodiments of the present disclosure relate to a panel testing device.

BACKGROUND

During the manufacturing process of LCDs and OLEDs, full contact detection is performed after cutting the panel needed to be tested, in order to achieve the accurate detection of defective products. In the full contact detection, each test pin in the test block is in one-to-to correspondence with the signal pin in the panel pad. As the resolution of the current panel is getting higher and higher, in actual production, the alignment deviation (misalignment between the test pin and the signal pin) is difficult to avoid, which affects the detection accuracy of the signal pin in the detection procedure.

SUMMARY

Embodiments of the present disclosure provide a panel testing device, which can make the signal pin and the test pin align with each other better, avoid the misalignment between the signal pin and the test pin, and improve the detection accuracy.

Embodiments of the present disclosure provide a panel testing device, which comprises: a supporter; and a plurality of test pins disposed on the supporter, wherein the plurality of test pins are in one-to-one correspondence with a plurality of signal pins on the tested panel, any one of the test pins satisfies d≤D≤d+L; wherein D is a width of the test pin, d is a width of the signal pin corresponding to the test pin, L is a minimum pitch between two adjacent signal pins.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
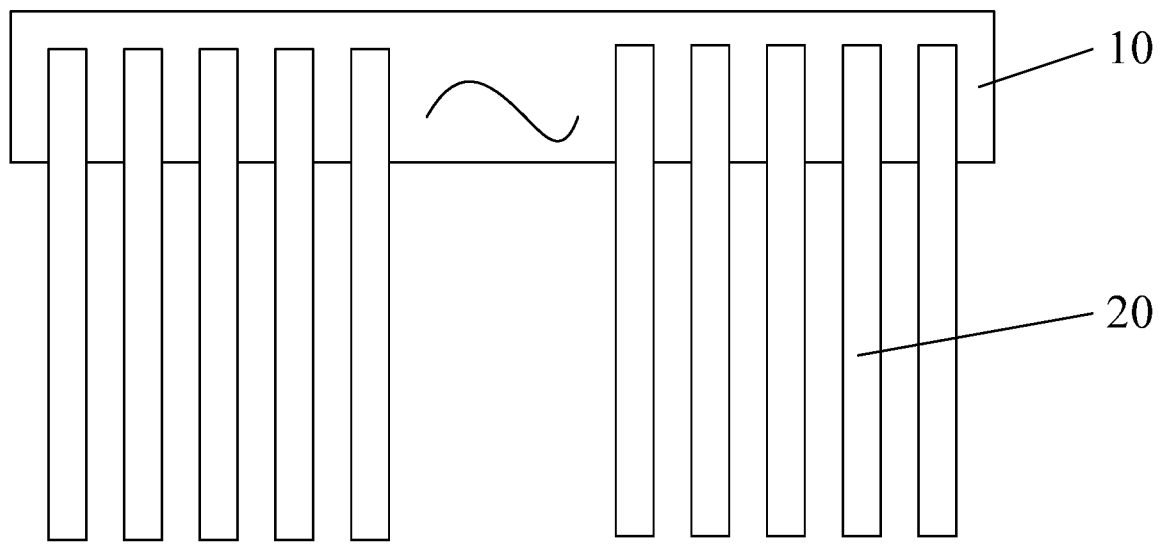
FIG. 1 schematically illustrates a top view of the test block.
Figure 2:
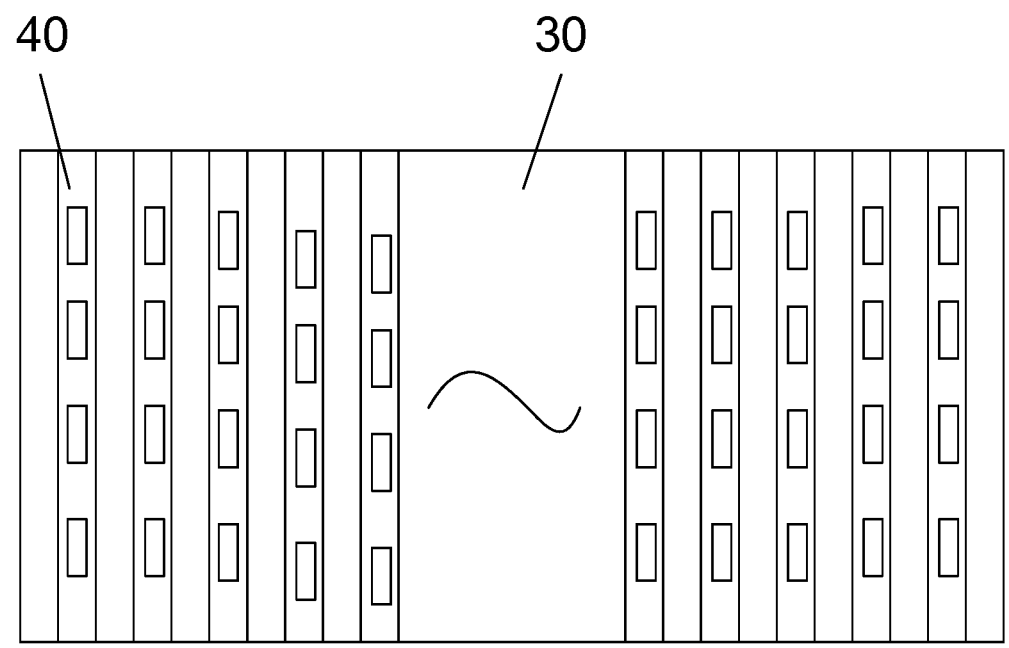
FIG. 2 schematically illustrates a top view of the tested panel.

FIG. 1 schematically illustrates test pins on the test block, and FIG. 2 schematically illustrates signal pins on the panel pad. Taking 55 inches OLEDs with a resolution of 3840*2160 as an example, there are 15360(3840*4) metal wires at an input side of the data signal (i.e., at an source side), due to adopting RGBW four sub-pixels to form one pixel. As a result, the width of the signal pins on the panel is relatively narrower, and the pitch between the signal pins is relatively smaller, so that it is difficult to make the test pins on the test block align with the signal pins on the panel pad in a one-to-one correspondence, which may cause the alignment deviation.

Figure 3:
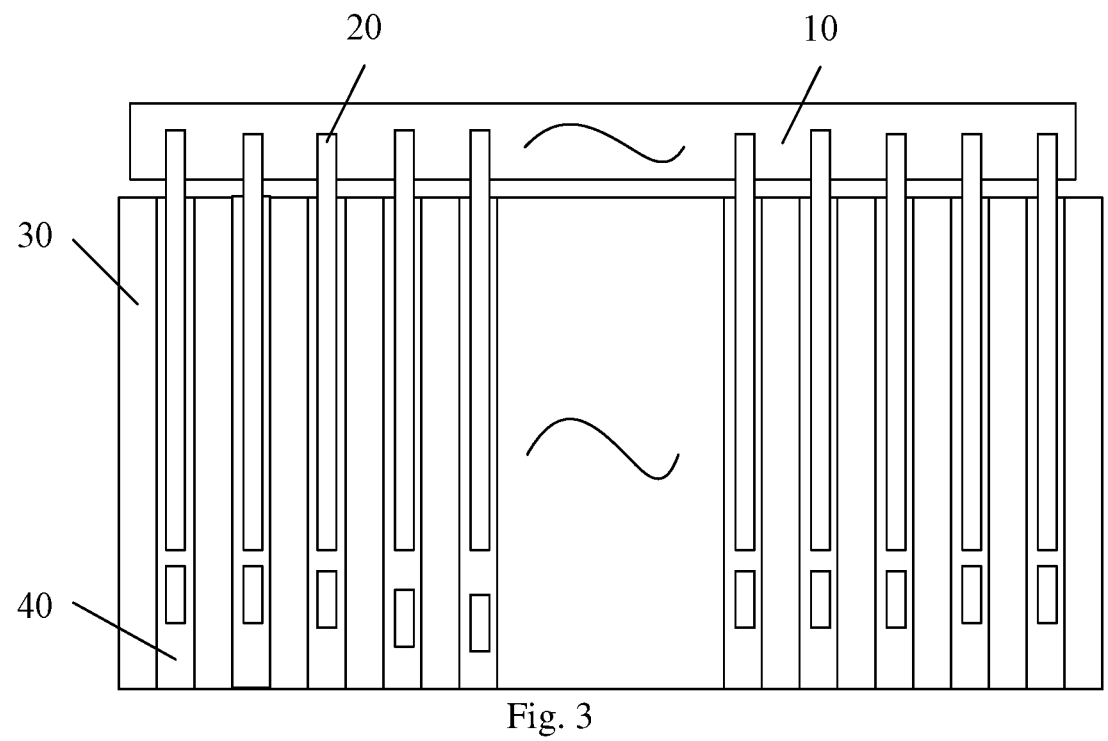
FIG. 3 schematically illustrates a top view in the case of correct alignment between the test block and the tested panel.
Figure 4:
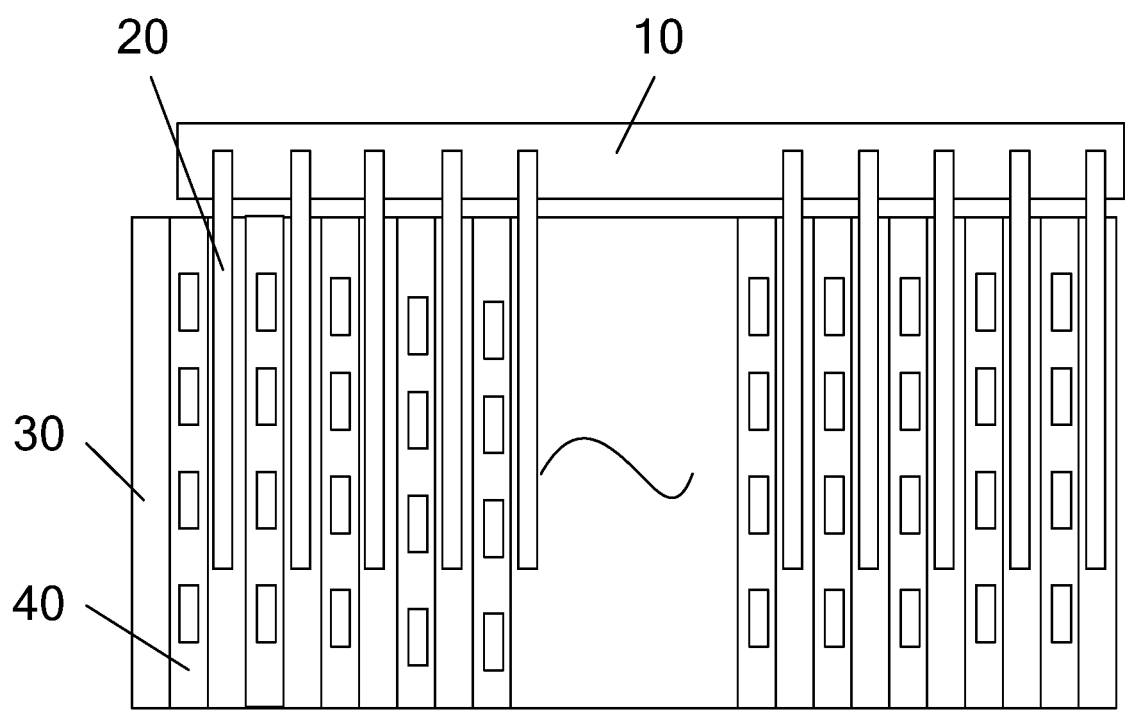
FIG. 4 schematically illustrates a top view in the case of misalignment between the test block and the tested panel.

FIG. 3 schematically illustrates the alignment between the test pins on the test block and the signal pins on the panel pad, and FIG. 4 schematically illustrates the misalignment between the test pins on the test block and the signal pins on the panel pad. The case of FIG. 4 where the defect is presented in a position where the test pins on the test block and the signal pins on the panel pad are misaligned (the position of the signal pins is misjudged) always occurs in actual production, which affects the detection accuracy.

Figure 5:
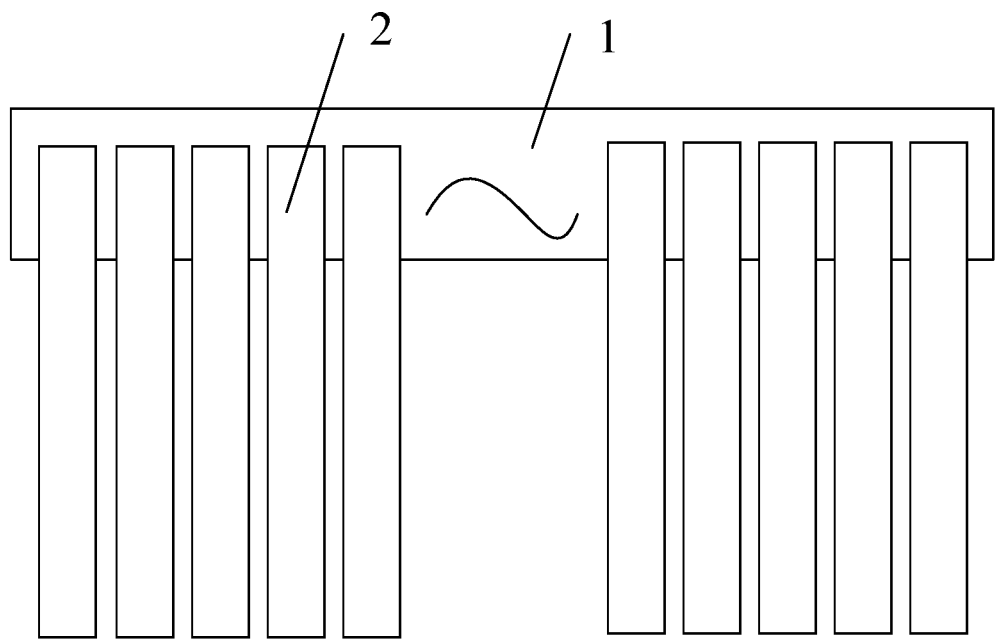
FIG. 5 schematically illustrates a top view of the panel testing device according to an embodiment of the present disclosure.
Figure 9:
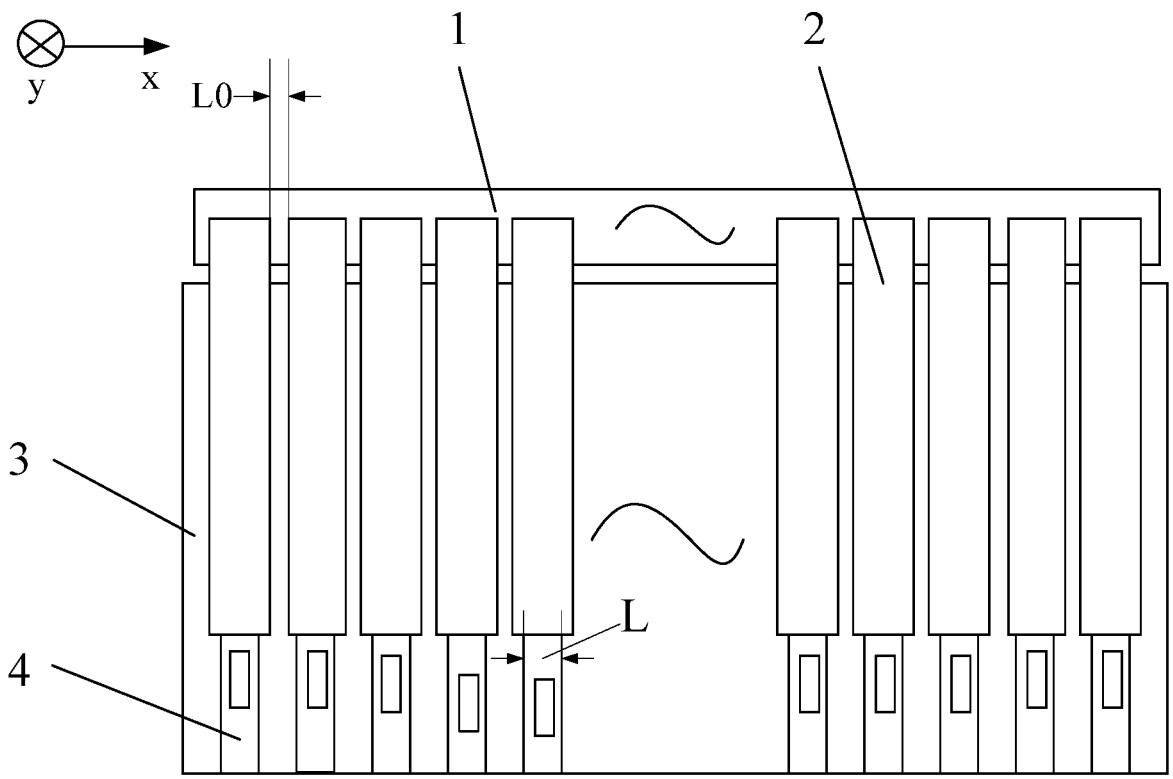
FIG. 9 schematically illustrates a top view in the case of alignment between the panel testing device and the tested panel according to an embodiment of the present disclosure.
Figure 10:
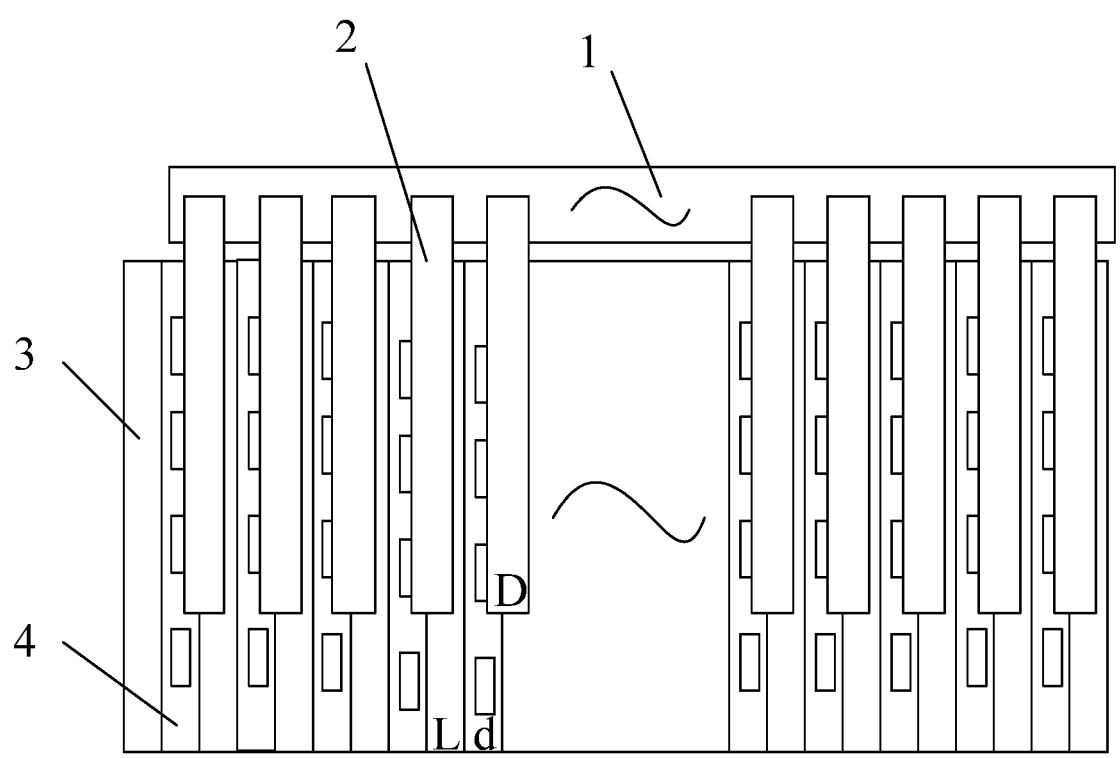
FIG. 10 schematically illustrates a top view in the case of misalignment between the panel testing device and the tested panel according to an embodiment of the present disclosure.

As illustrated in FIGS. 5, 9 and 10, there is provided a panel testing device according to an embodiment of the present disclosure, which comprises: a supporter 1; and a plurality of test pins 2 disposed on the supporter 1, wherein the position of the plurality of test pins 2 is in one-to-one correspondence with the position of a plurality of signal pins 4 on the tested panel 3, any one of the test pins 2 satisfies d≤D≤d+L.

Herein, D is a width of the test pin 2; d is a width of the signal pin 4 corresponding to the test pin; L is a minimum pitch between two adjacent signal pins 4.

For the panel testing device provided in embodiments of the present disclosure, the width of the test pin 2 is increased, therefore, the signal pin 4 and the test pin 2 can be better aligned when the panel testing device is aligned with the tested panel 3, and it is possible that the occurrence of misalignment between the signal pin 4 and the test pin 2 can be avoided, as a result, the state of each signal pin 4 can be detected accurately, and the detection accuracy of the signal pin 4 can be effectively increased.

As an example, the test pins 2 have the same width D. As another example, the signal pins 4 have the same width d. As a still another example, the width between every two adjacent signal pins 4 is equal and is equal to the minimum pitch described above. In this way, the alignment between the signal pin and the test pin can be realized more quickly and efficiently.

As illustrated in FIG. 9, the width of the test pin 2 is greater than the width of the signal pin 4. Thus, in the alignment operation, the orthographical projection of the test pin 2 in the plane of the tested panel 3 (i.e., the orthographical projection of the test pin 2 in y-direction) completely overlaps with the orthographical projection of the signal pin 4 in the plane of the tested panel 3, so it is simpler to achieve accurate alignment.

When the panel testing device is aligned with the tested panel 3, since the width of the test pin 2 is increased, at least part of the test pin 2 is in a contact and electrical connection with the corresponding signal pin 4, therefore, the accuracy of the alignment between the test pin 2 and the signal pin 4 can be effectively increased, the state of each signal pin 4 can be accurately detected, and the detection quality of the signal pin 4 can be ensured.

As illustrated in FIG. 10, in the alignment operation, even though there is a certain alignment deviation, the orthographical projection of the test pin 2 in the plane of the tested panel 3 (i.e., in the y-direction) partially overlaps with the orthographical projection of the signal pin 4 corresponding to the test pin 2 in the y-direction, the electrical connection between the test pin 2 and the signal pin 4 can still be maintained.

Figure 11:
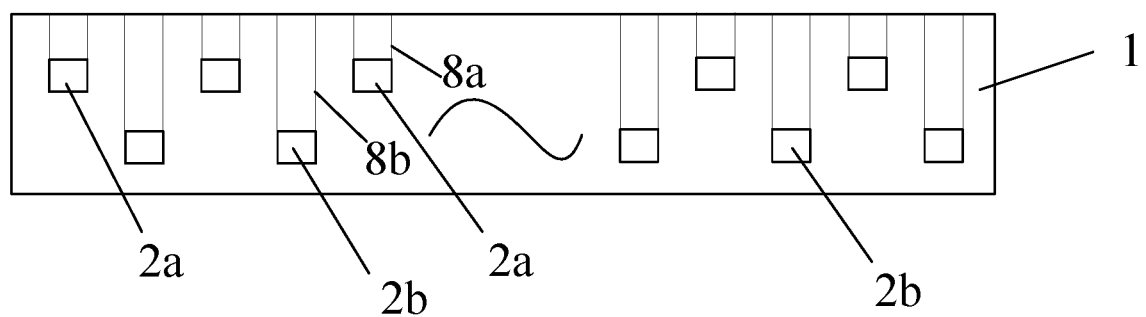
FIG. 11 schematically illustrates a front view of the panel testing device according to an embodiment of the present disclosure.

In at least some of the embodiments, in order to ensure that the two adjacent test pins 2 are independent of each other, the two adjacent test pins 2 are disposed on different layers (for the purpose of the present disclosure, two layers, three layers, four layers or the like can be adopted), in this way, the two adjacent test pins 2 are prevented from being short-circuited and the detection accuracy of the signal pins 4 would not be affected. For example, as illustrated in FIG. 11, a plurality of test pins 2a and a plurality of test pins 2b are arranged in two layers. The test pins 2a are disposed on the upper layer, and the test pins 2b are disposed on the lower layer, in this way, the short-circuit between any two adjacent test pins 2a, 2b can be avoided.

In at least some of the embodiments, there are slits with different depths disposed on the supporter 1, the depth of two adjacent slit are different from each other, and the test pins are disposed in the slits, thus the adjacent test pins are disposed on different layers. As illustrated in FIG. 11, a plurality of slits 8a, 8b are formed in the supporter 1, and the depth of slit 8a is smaller than the depth of slit 8b. Thus, the test pins 2a disposed in the slit 8a are disposed in the upper layer, and the test pins 2b disposed in the slit 8b are disposed in the lower layer. In this way, the fixing between the test pins and the supporter 1 is more stable. It can be understood that, the test pins may be fixed on the supporter by other means, for example, by riveting, welding, or the like.

In at least some of the embodiments, the plurality of test pins 2 are parallel to each other, which further ensure the accuracy of alignment. The arrangement of test pins 2 is consistent with the arrangement of the signal pins 4, by optimizing the arrangement of the test pins 2, it is more advantageous to detect the signal pins 4, and also reduce the difficulty in manufacturing the panel test device.

Figure 6:
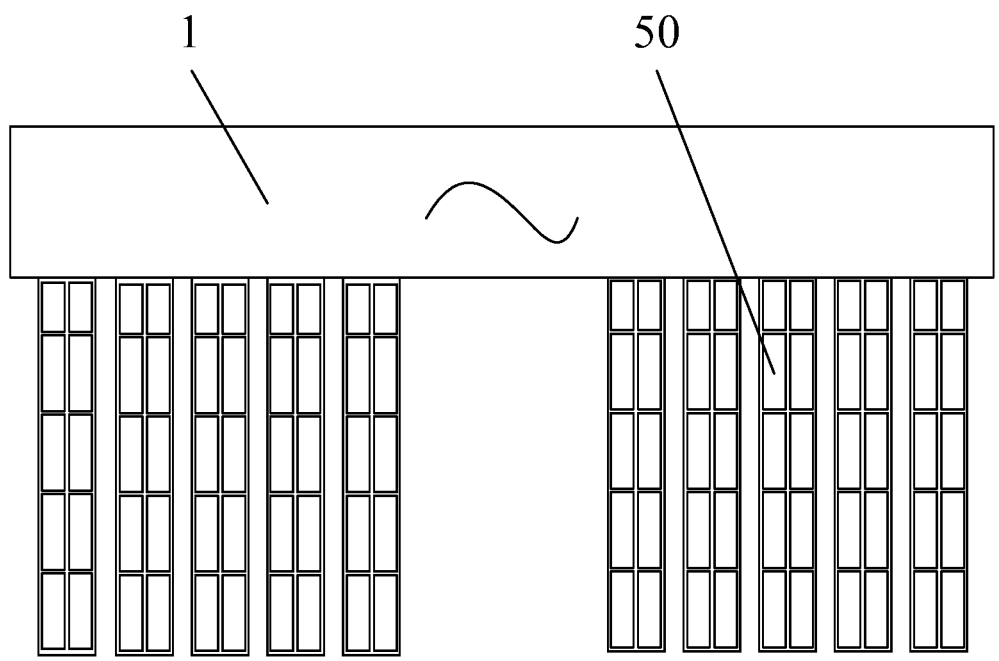
FIG. 6 schematically illustrates a panel testing device viewed from its back according to an embodiment of the present disclosure.

In at least some of the embodiments, as illustrated in FIG. 6, the panel test device further comprises: a conductor 50 configured to contact the signal pin 4, the conductor 50 is disposed on the test pin 2, and is electrically connected with the test pin 2. The test pin 2 is electrically connected with the corresponding signal pin 4 through at least one conductor 50 disposed thereon, and the conductor 50 is in better contact with the test pin 2.

For example, a plurality of conductors 50 are disposed on at least one of the test pin 2 (i.e., there are a plurality of conductors 50 disposed uniformly on the test pin 2). When the conductors 50 disposed on the test pin 2 are aligned with the corresponding signal pin 4, at least part of the conductors 50 contacts and is electrically connected with the signal pin 4. For example, the plurality of the conductors 50 on each test pin 2 are arranged in a matrix manner, and the plurality of the conductors 50 are arranged at equal pitches in both the transverse direction and the longitudinal direction.

Figure 12:
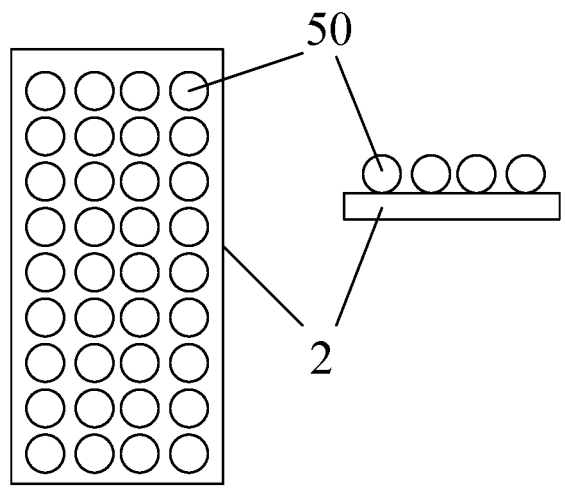
FIG. 12 schematically illustrates a conductor according to a still another embodiment of the present disclosure.

As illustrated in FIG. 6, the conductors 50 are disposed on a side of the test pin 2 proximal to the tested panel 3 (i.e., the back side of the test pin 2). In the alignment operation, the signal pin 4 is disposed under the test pin 2, so as to make contact with the conductor 50 disposed on the back side of the test pin 2. FIG. 12 schematically illustrates a top view of the test pin 2, the conductors 50 are disposed on a side of the test pin 2 distal to the tested panel 3, i.e., the front side of the test pin 2. In the alignment operation, the signal pin 4 is disposed above the test pin 2, so as to make contact with the conductors 50 disposed on the front side of the test pin 2.

Figure 7:
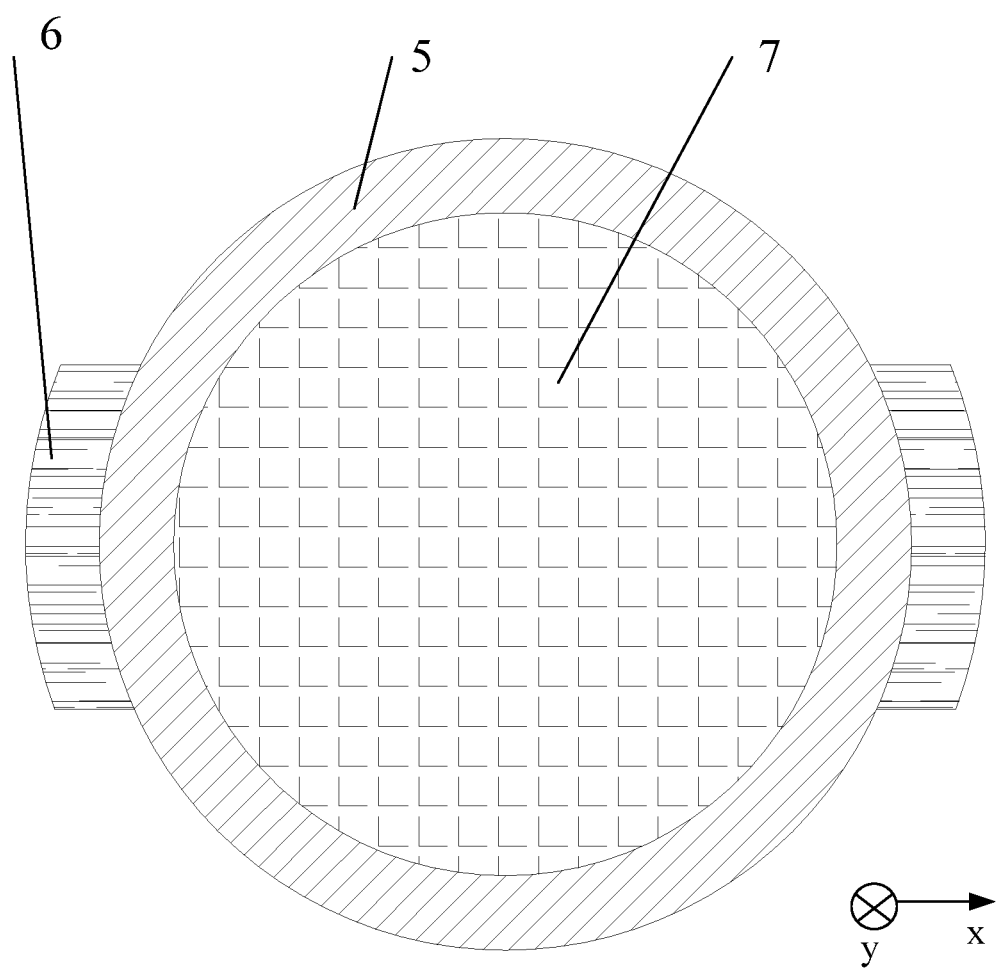
FIG. 7 schematically illustrates a cross-sectional view of a conductor according to an embodiment of the present disclosure.
Figure 8:
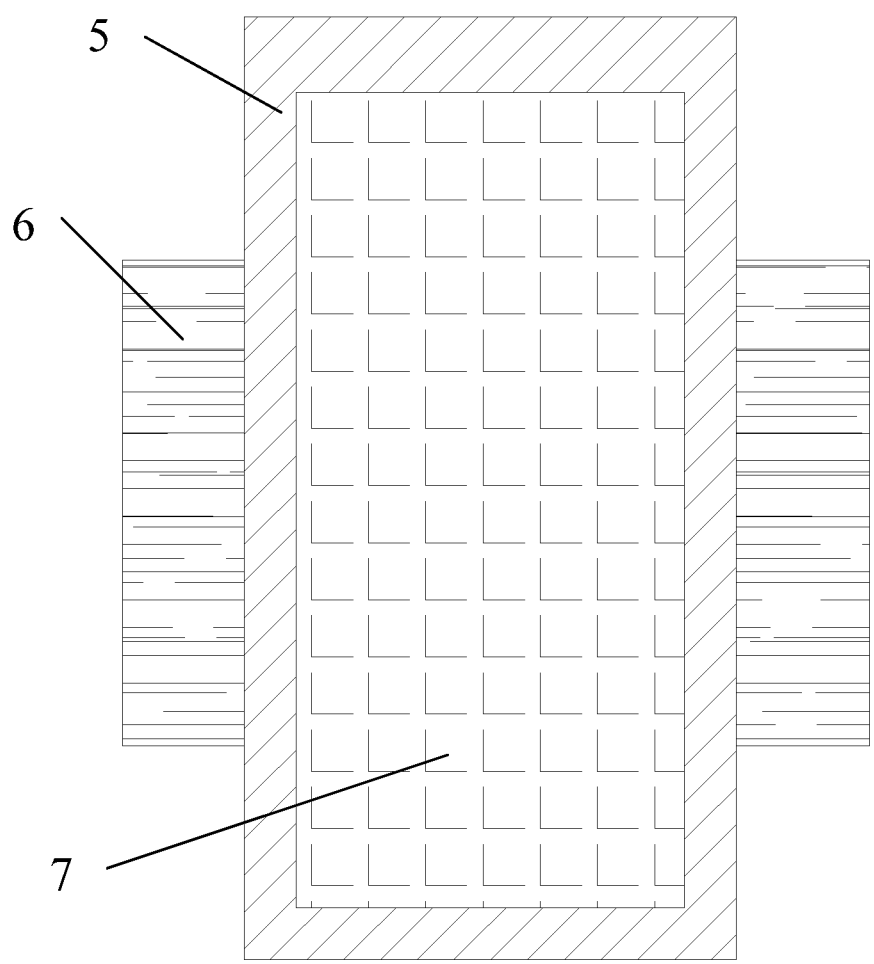
FIG. 8 schematically illustrates a cross-sectional view of a conductor according to another embodiment of the present disclosure.

In at least some of the embodiments, as illustrated in FIGS. 7 and 8, each conductor 50 comprises: a conductive portion 5; and insulating portions 6 disposed on at least two opposite surfaces of the conductive portion 5. For example, the insulating portions 6 are disposed on the two opposite surfaces of the supporter 1 in a transverse direction (length direction), in this way, the conductors 50 disposed on two adjacent test pins 2 can be prevented from being short-circuited with each other due to oblique contact (in case that the adjacent conductors 50 disposed on the two test pins 2 contact with each other due to unintended obliquely arranged, the short-circuit will not happen, because the insulating portions 6 disposed on the at least two opposite surfaces of the conductive portion 5 insulate the two conductors 50 from each other), and to ensure the accuracy of detection. The conductive portion 5 is made of a conductive material, such as metal or alloy, or the like. The insulating portion 6 is made of an insulating material, such as silicon dioxide, nitrogen oxide, or the like.

In at least some of the embodiments, the orthographical projection of the test pin 2 in the y-direction overlaps with the orthographical projection of the corresponding signal pin 4 in the y-direction, as illustrated in FIG. 9, the y-direction is perpendicular to the plane of the tested panel 3. When the conductors 50 are disposed on the test pins 2, the test pins 2 and the signal pins 4 are electrically connected with each other through at least one conductor 50 in the overlapping region. For example, as illustrated in FIG. 7, the insulating portions 6 are disposed on at least two opposite surfaces of the conductive portion 5 in x-direction, in this way, the test pin 2 and the corresponding signal pin 4 are electrically connected with each other in the y-direction, and the y-direction is perpendicular to the x-direction. Thus, it is possible to prevent the conductors 50 disposed on the adjacent test pins 2 from being short-circuited with each other due to oblique contact.

In at least some of the embodiments, as illustrated in FIGS. 7 and 8, the conductor 50 further comprises: an elastic portion 7, which is wrapped by the conductive portion 5. The conductive portion 5 covers an entire surface of the elastic portion 7, so that the surface of the elastic portion 7 has almost no exposed region. Due to the elastic portion 7, the conductor 50 is elastically deformable, it is possible that the conductor 50 and the corresponding signal pin 4 are in compaction contact, thus the false contact can be avoided. The elastic portion 7 is made of an elastic material.

In above embodiments, the conductors 50 are uniformly arranged on at least one of the test pins 2, and the conductors 50 on the same test pin 2 are electrically connected with the test pin 2. As long as there is one conductor 50 on the test pin 2 in contact with the corresponding signal pin 4, the electrical connection can be achieved, therefore, the accuracy and practicability of the detection can be increased.

In at least some of the embodiments, the conductor 50 is in a shape of a sphere (as illustrated in FIGS. 7 and 12) or a column (as illustrated in FIG. 8).

It can be understood that, the conductor 50 may be in other shapes, such as an ellipse, rectangle and so on, which may also achieve the object of the present disclosure, and be within the scope of the present disclosure.

In at least some of the embodiments, as illustrated in FIG. 5, the supporter 1 is of rectangle plate-shaped, and transversely arranged. A plurality of test pins 2 are disposed on the same side of the supporter 1, and one of ends of each test pin 2 proximal to the supporter 1 is fixed on the supporter 1, so it is more convenient for taking away or storing the panel testing device, and performing alignment detection between the panel testing device and the tested panel 3.

In at least some of the embodiments, as illustrated in FIGS. 9 and 10, the plurality of signal pins 4 have the same width d, and have the same pitch L between any two adjacent signal pins 4. Similarly, the plurality of test pins 2 have the same width D, and have the same pitch L0 between any two adjacent test pins 2. In this case, the pitch L0 is smaller than the pitch L.

In conclusion, in the panel testing device provided in embodiments of the present disclosure, since the width of the test pin is increased, the signal pin and the test pin are better aligned with each other when the panel testing device is aligned with the tested panel, as a result, the misalignment between the signal pin and the test pin is avoided, the state of each signal pin is detected accurately, and the detection accuracy of the signal pin is increased.

What is described above is related to the illustrative embodiments of the disclosure only and not limitative to the scope of the disclosure; the scopes of the disclosure are defined by the accompanying claims. In addition, the following points are needed to explain:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and a size of a layer or area may be enlarged or narrowed, that is, the drawings are not drawn in a real scale.

(3) In case of no conflict, features in one embodiment or in different embodiments can be combined as a new embodiment.

The invention claimed is:

1. A panel testing device, comprising:
   a supporter; and
   a plurality of test pins disposed on the supporter, the plurality of test pins being in one-to-one correspondence with a plurality of signal pins on a tested panel, and any one of the plurality of test pins configured to satisfy:

$d \leq D \leq d+L,$ wherein D is a width of the test pin, d is a width of the signal pin in one-to-one correspondence with the test pin, and L is a minimum pitch between two adjacent signal pins.

2. The panel testing device according to claim 1, wherein two adjacent test pins are disposed on different layers.

3. The panel testing device according to claim 1, wherein the supporter comprises a slit, and at least one of the plurality of test pins is disposed in the slit.

4. The panel testing device according to claim 1, wherein the plurality of test pins are parallel to each other.

5. The panel testing device according to claim 1, further comprising:
   a conductor configured to contact with the signal pin, wherein the conductor is disposed on at least one of the plurality of test pins and is electrically connected with the at least one of the plurality of test pins, and the at least one of the plurality of test pins is electrically connected with a corresponding signal pin through the conductor.

6. The panel testing device according to claim 5, wherein the conductor comprises:
   a conductive portion; and
   insulating portions, disposed on at least two opposite lateral surfaces of the conductive portion in a first direction and configured to insulate two adjacent conductors in the first direction from each other.

7. The panel testing device according to claim 6, wherein the conductor further comprises:
   an elastic portion, wrapped by the conductive portion.

8. The panel testing device according to claim 5, wherein the conductor comprises a plurality of conductors, the plurality of conductors are uniformly arranged on the at least one of the plurality of test pins, and at least part of the conductors is electrically connected with the at least one of the plurality of test pins.

9. The panel testing device according to claim 5, wherein the conductor is in a shape of a sphere or a column.

10. The panel testing device according to claim 1, wherein the plurality of test pins are disposed on a same side of the supporter, and one of ends of each test pin proximal to the supporter is fixed on the supporter.

11. The panel testing device according to claim 1, wherein the supporter is in a rectangle plate-shaped.

12. The panel testing device according to claim 1, wherein an orthographical projection of at least one of the plurality of test pins in a second direction overlaps with an orthographical projection of corresponding signal pin in the second direction, and the second direction is perpendicular to a plane of the tested panel.

13. The panel testing device according to claim 12, wherein the at least one of the plurality of test pins and the corresponding signal pin are electrically connected with each other through at least one conductor in an overlapping region.

14. The panel testing device according to claim 1, wherein the plurality of signal pins are arranged equally with a first pitch, the plurality of test pins are arranged equally with a second pitch, and the first pitch is greater than the second pitch.

15. The panel testing device according to claim 2, wherein the supporter comprises a slit, and at least one of the plurality of test pins is disposed in the slit.

16. A panel testing device, comprising:
a supporter,
a plurality of slits formed in the supporter, any two adjacent slits having different depths; and
a plurality of test pins, each of the plurality of test pins being disposed in a corresponding one of the plurality of slits, the plurality of test pins being in one-to-one correspondence with a plurality of signal pins on a tested panel, and any one of the plurality of test pins being configured to satisfy:

$$d \leq D \leq d+L,$$

wherein D is a width of the test pin, d is a width of the signal pin in one-to-one correspondence with the test pin, and L is a minimum pitch between two adjacent signal pins.

17. The panel testing device according to claim 16, wherein two test pins respectively disposed in the any two adjacent slits are located at different depth in the supporter.

* * * * *